US008896301B2

(12) United States Patent
Oka et al.

(10) Patent No.: US 8,896,301 B2
(45) Date of Patent: Nov. 25, 2014

(54) PORTABLE ELECTRONIC DEVICE ADAPTED TO COMPENSATE FOR GYROSCOPE BIAS

(75) Inventors: Anand Ravindra Oka, Waterloo (CA); Nazih Almalki, Waterloo (CA); Christopher Harris Snow, Kitchener (CA)

(73) Assignee: BlackBerry Limited, Waterloo, Ontario (CA)

( * ) Notice: Subject to any disclaimer, the term of this patent is extended or adjusted under 35 U.S.C. 154(b) by 470 days.

(21) Appl. No.: 13/036,611

(22) Filed: Feb. 28, 2011

(65) Prior Publication Data
US 2012/0217958 A1    Aug. 30, 2012

(51) Int. Cl.
G01R 33/02    (2006.01)
G01P 3/48    (2006.01)
G01B 7/30    (2006.01)
G01R 33/028    (2006.01)

(52) U.S. Cl.
CPC .......... G01R 33/0206 (2013.01); G01R 33/028 (2013.01)
USPC ....... 324/244; 324/225; 324/173; 324/207.25

(58) Field of Classification Search
USPC .......................................... 324/173, 225, 244
See application file for complete search history.

(56) References Cited

U.S. PATENT DOCUMENTS 7,587,277 B1    9/2009    Wells
8,195,392 B2 *  6/2012    Watanabe et al. ............. 701/472
2006/0038718 A1    2/2006    Arakane et al.
2010/0223582 A1 *  9/2010    Dods ............................ 715/863
2011/0163955 A1 *  7/2011    Nasiri et al. ................. 345/158

FOREIGN PATENT DOCUMENTS

EP    1077579    2/2001
EP    1870670    12/2007

OTHER PUBLICATIONS

Extended European Search Report, European Patent Office, European Patent Application Serial No. 11156331.8 dated Aug. 8, 2011.
Ryan M. Wiesman : "Robust Longitudinal Rate Gyroscope Bias Estimation for Reliable Pitch Attitude Observation through utilization of a displaced accelerometer arry." Dec. 2008, Rochester Institute of Technology.
Response to Extended European Search Report, European Patent Office, European Patent Application Serial No. 11156331.8 dated May 3, 2013.
Canadian Patent Office, Examiner's Report, Canadian Patent Application Serial No. 2,769,085. Mailed Jun. 13, 2013.

* cited by examiner

*Primary Examiner* — Bot Ledynh
(74) *Attorney, Agent, or Firm* — Bereskin & Parr LLP

(57) ABSTRACT

According to one aspect, there is provided a method for compensating for gyroscope bias on a portable electronic device having a gyroscope, and at least one of an accelerometer and a magnetometer. The method includes determining a first attitude matrix and a second attitude matrix using data from the accelerometer and the magnetometer, determining a difference between the first attitude matrix and the second attitude matrix, estimating a rotational velocity based on the difference between the first attitude matrix and the second attitude matrix, and compensating for an output from the gyroscope to generate a compensated output that compensates for the gyroscope bias using the estimated rotational velocity.

20 Claims, 4 Drawing Sheets

PORTABLE ELECTRONIC DEVICE ADAPTED TO COMPENSATE FOR GYROSCOPE BIAS

FIELD

Embodiments herein relate to portable electronic devices, and in particular to portable electronic devices having a gyroscope and which are adapted to compensate for gyroscope bias.

BACKGROUND

Portable electronic devices have gained widespread use and may provide various functions including telephonic functions, electronic text messaging or other personal information manager (PIM) application functions, gaming, navigation, and so on. Portable electronic devices include various types of devices such as cellular phones, smart phones, Personal Digital Assistants (PDAs), and tablet computers.

In some cases, portable electronic devices may be touch sensitive devices. For example, some devices may include a display (e.g. a liquid crystal display (LCD)) with a touch-sensitive overlay, which may be particularly useful in a tablet computing device or where limited space is available for user input.

In some embodiments, a portable electronic device may include a keypad having a plurality of keys and optionally one or more function buttons in addition to the display. Other devices may not have a keypad.

Some portable electronic devices include a gyroscope for measuring the rotational velocity of the device. Measuring the rotational velocity of the device may be particularly useful for applications related to gaming, navigation, or augmented reality, for example.

BRIEF DESCRIPTION OF THE DRAWINGS

Embodiments of the present disclosure will now be described, by way of example only, with reference to the attached figures, in which.

DETAILED DESCRIPTION

Figure 1:
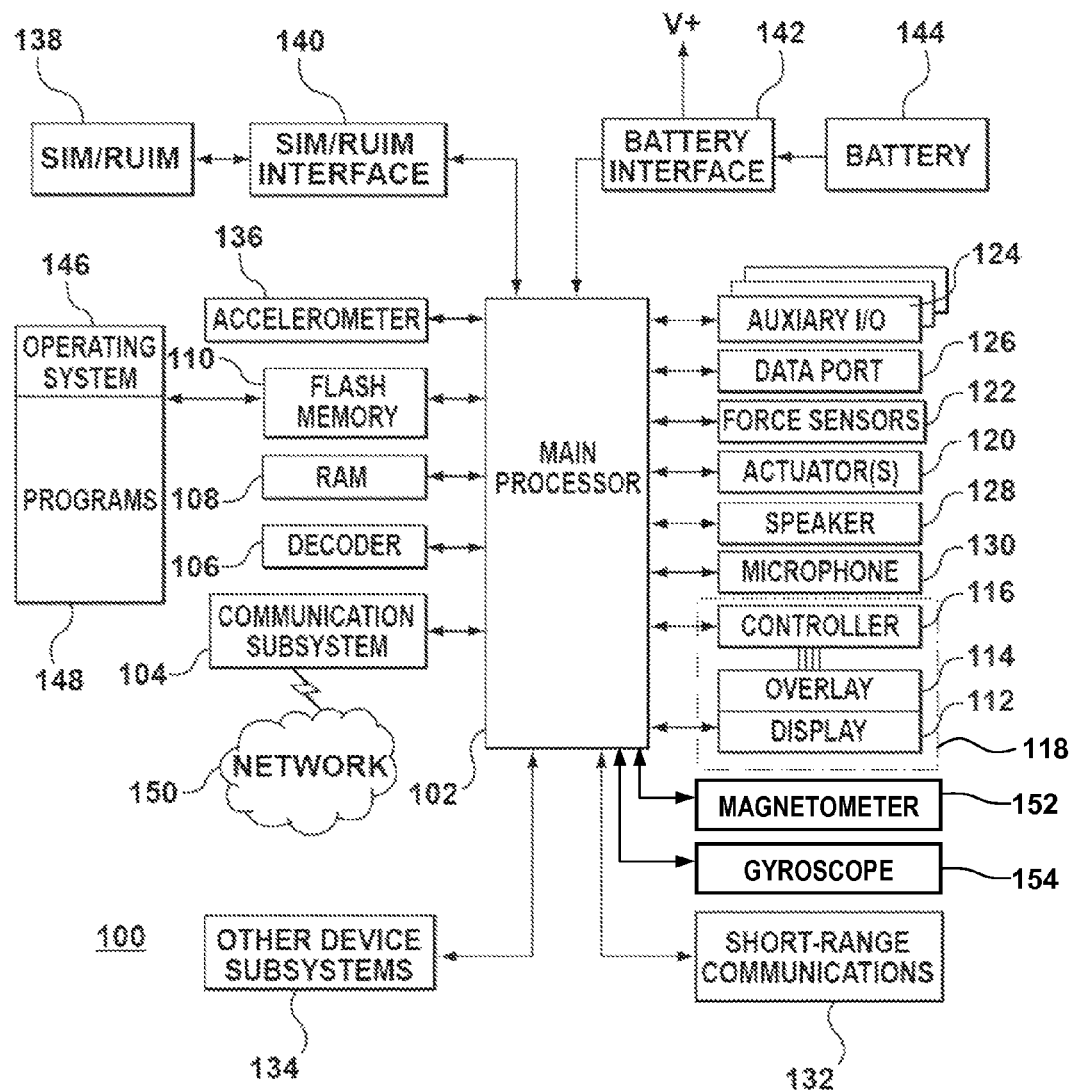
FIG. 1 is a simplified block diagram of components of a portable electronic device according to one embodiment.

It will be appreciated that for simplicity and clarity of illustration, where appropriate, reference numerals may be repeated among the figures to indicate corresponding or analogous elements. In addition, numerous specific details are set forth in order to provide a thorough understanding of the example embodiments described herein. In some instances, well-known methods, procedures and components have not been described in detail so as not to obscure the embodiments described herein.

According to one aspect, a method for compensating for gyroscope bias on a portable electronic device having a gyroscope, an accelerometer and a magnetometer, the method comprising determining a first attitude matrix and a second attitude matrix using data from the accelerometer and the magnetometer, determining a difference between the first attitude matrix and the second attitude matrix, estimating a rotational velocity based on the difference between the first attitude matrix and the second attitude matrix, and compensating for an output from the gyroscope to generate a compensated output that compensates for the gyroscope bias using the estimated rotational velocity.

According to another aspect, there is provided a portable electronic device, comprising a gyroscope for detecting the rotational velocity of the device, an accelerometer for detecting the acceleration experienced by the device, a magnetometer for determining the position and orientation of the device with respect to a magnetic field, and at least one processor coupled with the gyroscope, the accelerometer and the magnetometer, the at least one processor adapted to: determine a first attitude matrix and a second attitude matrix using data from the accelerometer and the magnetometer, determine a difference between the first attitude matrix and the second attitude matrix, estimate a rotational velocity based on the difference between the first attitude matrix and the second attitude matrix, and compensate for an output from the gyroscope to generate a compensated output that compensates for the gyroscope bias using the estimated rotational velocity.

According to yet another aspect, a method for compensating for gyroscope bias on a portable electronic device having a gyroscope, an accelerometer and an electronic compass, the method comprising determining a first attitude matrix and a second attitude matrix using data from the accelerometer and the electronic compass, estimating a rotational velocity based on a difference between the first attitude matrix and the second attitude matrix, and compensating for an output from the gyroscope to generate a compensated output that compensates for the gyroscope bias using the estimated rotational velocity.

FIG. 1 shows a simplified block diagram of components of a portable electronic device 100 according to one embodiment. As shown, the portable electronic device 100 includes a processor 102 that controls at least some operations of the portable electronic device 100.

Communication functions, including data communications, voice communications, or both may be performed through a communication subsystem 104. In some embodiments, data received by the portable electronic device 100 may be decompressed and decrypted by a decoder 106.

The portable electronic device 100 may be a battery-powered device and as shown may include a battery interface 142 for receiving one or more batteries 144.

The communication subsystem 104 may receive messages from, and send messages to, a wireless network 150. The wireless network 150 may be any type of wireless network, including, but not limited to, data-centric wireless networks, voice-centric wireless networks, and dual-mode networks that support both voice and data communications (for example 3G or 4G networks).

The processor 102 generally interacts with subsystem components such as a Random Access Memory (RAM) 108, a flash memory 110, and a display 112 (which may have a touch-sensitive overlay 114 connected to an electronic controller 116 that together form a touch-sensitive display 118). Information, such as text, characters, symbols, images, icons, and other items may be displayed on the touch-sensitive display 118.

In some embodiments, user-interaction with the graphical user interface may be performed through the touch-sensitive overlay 114. In particular, the processor 102 may interact with the touch-sensitive overlay 114 via the electronic controller 116.

Other components could include an actuator assembly 120, one or more optional force sensors 122, an auxiliary input/output (I/O) subsystem 124, a data port 126, one or more speakers 128, a microphone 130, a short-range communications module 132 and other device subsystems 134.

In some embodiments, to identify a user as a subscriber for network access, the portable electronic device 100 may use a Subscriber Identity Module (SIM) or a Removable User Identity Module (RUIM) card 138 inserted into a SIM/RUIM interface 140 for communication with the wireless network 150. Alternatively, user identification information may be programmed into the flash memory 110, or via other techniques.

The portable electronic device 100 also generally includes an operating system 146 and software components 148 that are executed by the processor 102. The operating system 146 and software components 148 may be stored in a persistent data storage device, such as the flash memory 110 or another data storage device.

In some embodiments, applications may be loaded onto the portable electronic device 100 through the wireless network 150, the auxiliary I/O subsystem 124, the data port 126, the short-range communications subsystem 132, or any other suitable device subsystem 134.

In use, a received signal such as a text message, an e-mail message, or web page download may be processed by the communication subsystem 104 and input to the processor 102. The processor 102 may then process the received signal for output to the display 112 or to the auxiliary I/O subsystem 124 (or both). In some embodiments, a user may compose data items, such as e-mail messages, which may be transmitted over the wireless network 150 through the communication subsystem 104.

For voice communications, the overall operation of the portable electronic device 100 may be similar. For example, the speaker 128 may output audible information converted from electrical signals, and the microphone 130 may convert received audible information into electrical signals for processing.

As shown, the processor 102 may also be coupled to an accelerometer 136. The accelerometer 136 may be used for detecting the acceleration experienced by the device 100, for example by measuring the direction of gravitational forces or gravity-induced reaction forces on the device 100. The accelerometer 136 generally measures weight per unit of mass, also known as specific force or G-forces (Gs), acting on the device 100.

For example, when the device 100 is at rest, the accelerometer 136 will record the effect of gravity on the device 100 as one G acting downward, generally towards the center of the Earth. On the other hand, if the device is being lifted, then the accelerometer 136 will record a force more than one G acting on the device. In contrast, when the device 100 is in free fall (e.g. the device 100 has been dropped), the accelerometer 136 will measure zero Gs acting on the device 100.

In some embodiments, the accelerometer 136 could include a cantilever beam with a proof mass and suitable deflection sensing circuitry for detecting the acceleration forces acting on the device 100.

As shown, the portable electronic device 100 also includes a magnetometer 152 or another suitable electronic compass. The electronic compass may facilitate location and direction based services, such as navigation, by sensing the position of the portable electronic device 100 in relation to one or more magnetic fields, particularly the Earth's magnetic field.

In some embodiments, the magnetometer 152 may include a multi-axis magneto-impedance sensor (e.g. a three-axis magneto-impedance sensor) or another suitable sensor. For example, the magnetometer 152 may include three magneto-impedance (MI) sensors within a single integrated circuit package, each MI sensor operable to detect a magnetic field along a particular axis. The portable electronic device 100 can use signals from the MI sensors to determine direction or location information (or both) for the portable electronic device 100, which may be useful for navigating or for other applications.

Figure 2:
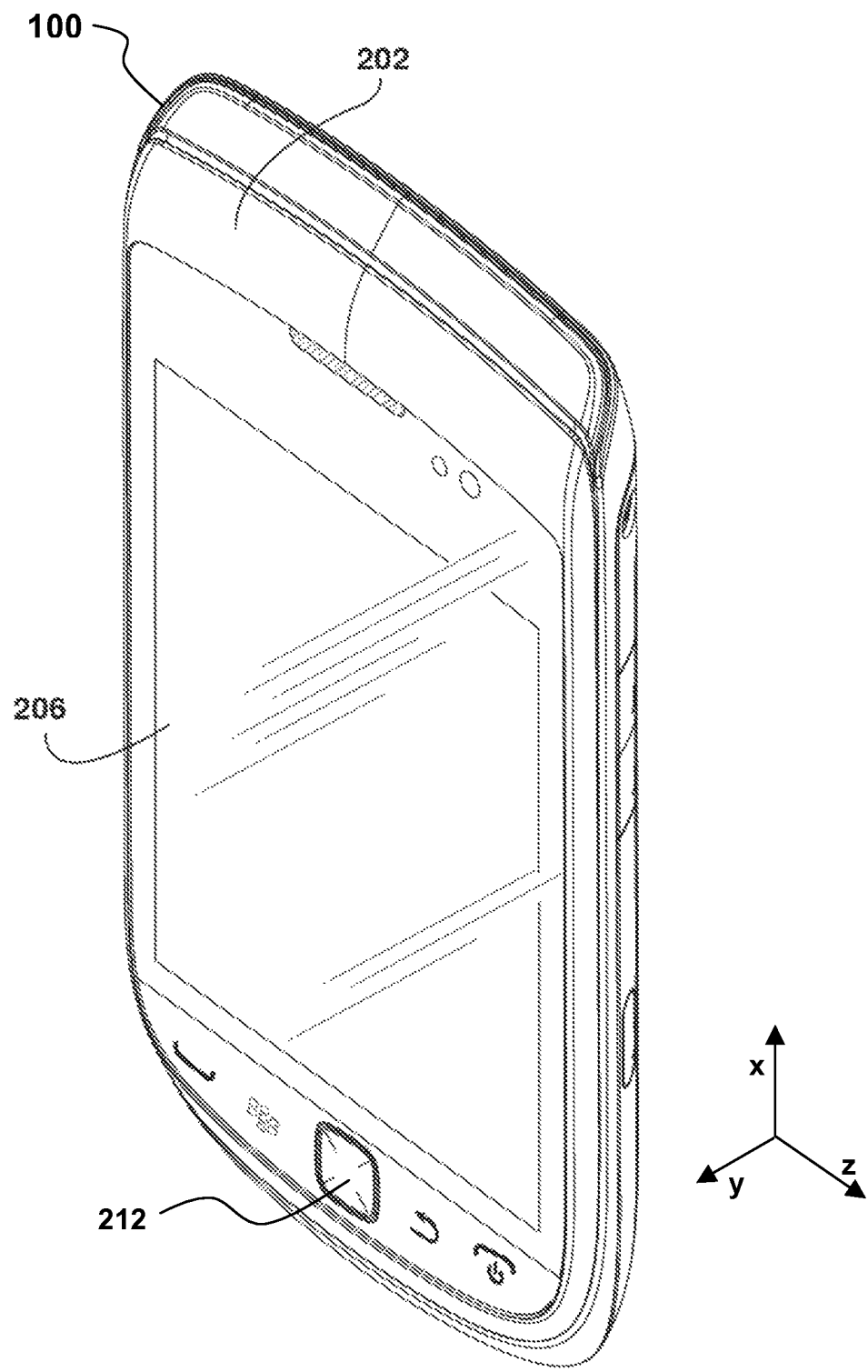
FIG. 2 is a first perspective view of the portable electronic device.

In particular, in a three-axis magneto-impedance sensor, magnetic fields may be measured along each of three orthogonal axes (e.g. an x-axis, a y-axis and a z-axis as shown in FIG. 2) to help determine an attitude matrix for the device 100 such that the position and direction of the portable electronic device 100 with respect to a global coordinate system (e.g. a global frame of reference) can be determined. This measurement may subject to a certain degree of error or noise depending on the characteristics of the sensor in the electronic compass (e.g. the quality of the magnetometer 152), magnetic interference in the operating environment, and so on.

As shown in FIG. 1, the portable electronic device 100 also includes a gyroscope 154. The gyroscope 154 is adapted to measure the rotational velocity of the portable electronic device 100 in the local frame of reference of the device 100. For example, when the device 100 is at rest, the gyroscope 154 generally indicates that the device 100 is stationary. Conversely, when the device 100 is being rotated (e.g. about one or more of the x-axis, the y-axis and the z-axis as shown in FIG. 2), the gyroscope 154 indicates the relative movement of the device 100 about one or more of these axes.

In particular, the gyroscope 154 may be a 3-axis gyroscope adapted to measure pitch, roll and yaw of the device 100 about three axes (e.g. the x-axis, the y-axis and the z-axis).

The gyroscope 154 may be useful for various purposes, such as for detecting specific movements of the device 100 as user gestures (e.g. tilting, rolling or rotating of the device 100 in a specific manner), which could be used to control movement of one or more objects displayed on the display screen of the device 100 or for other purposes. The gyroscope 154 may be particularly useful for gaming, where gestures with the device 100 may be used to move a game piece, turn a steering wheel in a racing game, and so on.

The gyroscope 154 may also be useful for other applications. For example, the gyroscope 154 may be used to help generate an attitude matrix for the device 100 that could be used with augmented reality applications. For example, an augmented reality application may work in conjunction with an image or a video camera to display images (in some embodiments in real-time or substantially real time) of the surrounding environment overlaid with information of interest to the user (e.g. street names of the streets being displayed on the display, menus for a restaurant being displayed, arrows indicating directions to a desired location such as a parked car, labels of stars and constellations in the night sky, and so on).

Generally, the attitude matrix is a 3×3 matrix that describes the orientation of the portable electronic device 100 with respect to a global coordinate system (e.g. a global frame of reference). In a conventional representation, the columns of the attitude matrix may be global unit vectors (for example along the EAST, NORTH and UP directions) expressed in a local (e.g. device 100) coordinate system.

The attitude matrix can be viewed as a transformation that takes global vectors and maps them into the local frame of reference. For example, if a vector represents the position or orientation of a particular object (e.g. a star in the sky) in a global coordinate system, the position of that particular object in the local coordinate system is given by U s, where U is the attitude matrix. Thus, the vector U s, plotted in the local coordinate system, always points to that particular object (e.g. that particular star) regardless of how the device 100 is held or moved.

Conversely the transpose of the attitude matrix U can be viewed as a transformation that calculates the global coordinates of a vector that is known with respect to a local frame of reference. This can be used, for example, to get the absolute orientation of a particular portion of the device 100 (e.g. the top of the device 100) in the global coordinate system to determine, for example, which physical object that portion of the device 100 is pointing towards.

In some embodiments, the gyroscope 154 could include an electronic gyroscope, such as a vibrating structure gyroscope manufactured with MEMS (micro-electro-mechanical sensors) technology (e.g. a MEMS gyroscope). A MEMS gyroscope is a low-cost sensor that tends to be suitable for use with portable electronic devices 100. In other embodiments, other suitable gyroscopes 154 may be used in the portable electronic device 100.

Turning now to FIG. 2, illustrated generally therein is a perspective view of the portable electronic device 100 according to one embodiment. As shown, in this embodiment the portable electronic device 100 includes a housing 202 that generally includes the functional components therein (e.g. processor 102, RAM 108, accelerometer 136, magnetometer 152, and gyroscope 154).

As shown, the housing 202 also supports a display 206. The display 206 could be an LCD or other suitable display and may be a touch screen (e.g. the touch screen display 118).

For reference, the coordinate system shown in FIG. 2 has been defined as having the x-axis aligned with a longitudinal axis of the portable electronic device 100, the y-axis normal to the plane of the display 206, and the z-axis perpendicular to the x-axis and y-axis. It will be appreciated that this is for convenience only and that other coordinate systems could also be defined, and in particular the portable electronic device 100 may have various other shapes and configurations.

As described above, the gyroscope 154 may be used for determining a rotational velocity of the device 100, which may be useful for games, augmented reality applications, and the like. However, one problem with the gyroscope 154 is a phenomenon known as gyroscope bias.

In general, all types of sensors tend to be subject to some amount of noise or other factors that can impact the accuracy or the precision of the sensors. Gyroscopes tend to be relatively unaffected by noise and other factors (e.g. perturbations due to device accelerations and surrounding magnetic fields) that affect the precision of the gyroscope readings. Accordingly, the gyroscope 154 can be considered as a relatively low noise sensor.

Gyroscopes are also generally very responsive, and can quickly recognize abrupt movements of the portable electronic device 100. Accordingly, the gyroscope 154 may be quite proficient at recognizing quick gestures or movements of the device 100 when they occur.

However, gyroscopes tend to suffer from a large sensor bias usually known as the gyroscope bias that can affect the accuracy of the gyroscope's readings. The gyroscope bias can be caused by voltage fluctuations or other variations that are inherent to gyroscope sensors, particularly MEMS gyroscopes.

Gyroscope bias also tends to vary significantly over time in an unpredictable manner. For example, in some cases the gyroscope bias may vary by as much as 30 degrees/sec/sec (or more) in random or unpredictable ways. The unpredictability can make it difficult to anticipate or compensate for gyroscope bias.

Moreover, gyroscope bias may be especially severe in lower cost gyroscopes, such as those that are often installed in portable electronic devices (e.g. the gyroscope 154).

The effects of gyroscope bias can cause significant problems for augmented reality applications. For example, an application (e.g. a driving game) designed to measure gestures or other movement of the device 100 (e.g. a tilt gesture) using the gyroscope 154 may experience a high degree of error, leading to incorrect gesture inputs or in some cases even missed inputs.

Similarly, an application that uses the gyroscope 154 data to update an attitude matrix of the portable electronic device 100 will tend to diverge or drift. This lead to some applications (e.g. virtual or augmented reality applications) experience dizzying effects. For example, even when the device 100 is being held still, it may react as if it is being rotated. For instance, a user holding the device 100 stationary and using an augmented reality application to view star patterns in the night sky may see the content on the display 206 begin to move and change due to the gyroscope bias even though the device 100 is being held still.

Accordingly, it would be beneficial to compensate for this gyroscope bias to provide for more relatively unbiased readings of rotational velocity of the device 100 and to eliminate these undesirable divergence or drift effects.

Generally, according to at least some methods as described herein, the bias of the gyroscope 154 may be at least partially compensated for by collecting and processing information from the accelerometer 136 and magnetometer 152 (or another suitable electronic compass). This information is then used to generate an estimated rotational velocity V of the portable electronic device 100. The estimated rotational velocity V may then be sent to a compensation module that compensates for the raw output W of the gyroscope 154 (which includes the gyroscope bias), to generate a compensated gyroscope output OUT.

In some embodiments, the compensation may further include a feedback control loop that tracks a residual output error in the compensated gyroscope output OUT and attempts to compensate or reduce that error.

In some embodiments, the accelerometer 136 and magnetometer 152 may be used continuously to generate the estimated rotational velocity V (e.g. in real-time or substantially real time) so as to compensate for changes in the gyroscope bias over time.

Figure 3:
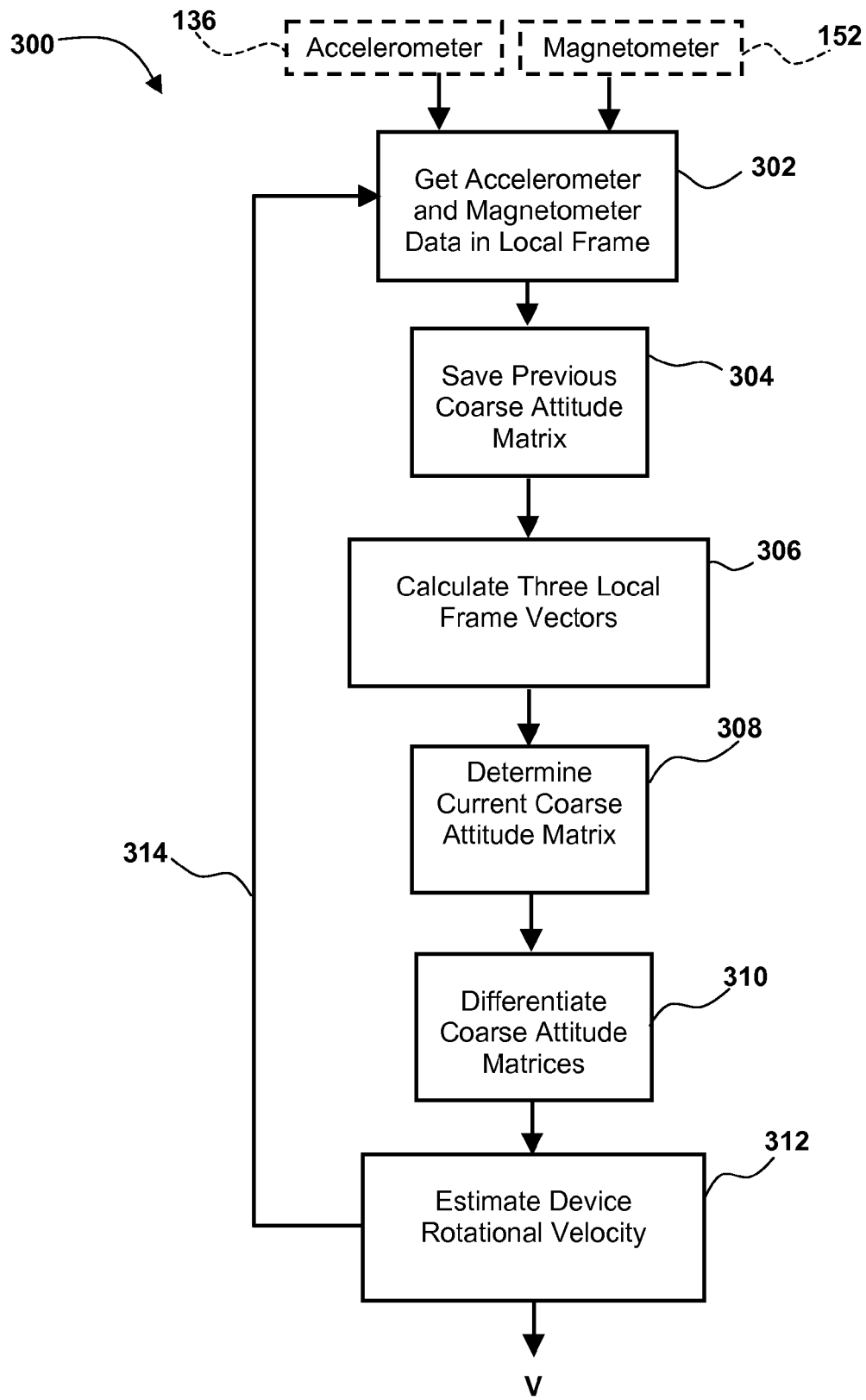
FIG. 3 is a flowchart of a method of estimating the rotational velocity of a portable electronic device using an accelerometer and a magnetometer.

For example, turning now to FIG. 3, illustrated therein is a flowchart showing a method 300 of generating an estimate of the rotational velocity of a portable electronic device using an accelerometer (e.g. the accelerometer 136) and an electronic compass (e.g. the magnetometer 152) according to one embodiment.

At step 302, the method includes obtaining the current accelerometer and magnetometer data for the local frame of reference of the portable electronic device (e.g. the device 100) from the accelerometer 136 and the magnetometer 152 as shown.

At step 304, a previous course attitude matrix Aold (which may also be referred to as a raw attitude matrix) for the portable electronic device is stored. This previous course attitude matrix Aold is indicative of the attitude matrix of the device at a previous time (e.g. a first time before the current instance of the method 300).

During an initialization routine (e.g. the first time the method 300 is executed), the previous course attitude matrix Aold can be set to some predetermined value (e.g. zero, an identity matrix, and so on). Subsequently, however, the previous course attitude matrix Aold will normally be set to the value of the coarse attitude matrix A as determined at step 308 from the previous time the method 300 was executed (as will be described below).

At step 306, at least three local frame vectors are determined based on the accelerometer 136 and magnetometer 152 data collected at step 302. For example, EAST, NORTH and UP vectors may be calculated for the local frame of reference of the portable electronic device 100. In one embodiment, the UP vector may be determined from the accelerometer 136 data, the EAST vector may be determined as a cross product of the magnetometer 152 data and the UP vector, and a NORTH vector may be determined as a cross product of the UP vector and the EAST vector.

At step 308, the local frame vectors (e.g. EAST, NORTH and UP) calculated at step 306 are used to determine the current coarse attitude matrix A. This current coarse attitude matrix A generally describes the current position and orientation of the portable electronic device 100 relative to a global coordinate system (e.g. at a second time as compared to the previous course attitude matrix Aold).

At step 310, the difference D between the current coarse attitude matrix A and the previous course attitude matrix Aold is determined. This difference D gives a relative indication of the positional change of the device 100 between a first time (when the previous coarse attitude matrix Aold was determined) and a second time (when the current coarse attitude matrix A was determined).

At step 312, a rotational velocity estimate V of the device is made using the determined current course attitude matrix A and the difference D between the current course attitude matrix A and the previous course attitude matrix Aold. In particular, in one embodiment, the rotational velocity estimate V may be determined using the mean of the cross product of the current coarse attitude matrix A and the difference D between the current coarse attitude matrix A and the previous coarse attitude matrix Aold.

Figure 4:
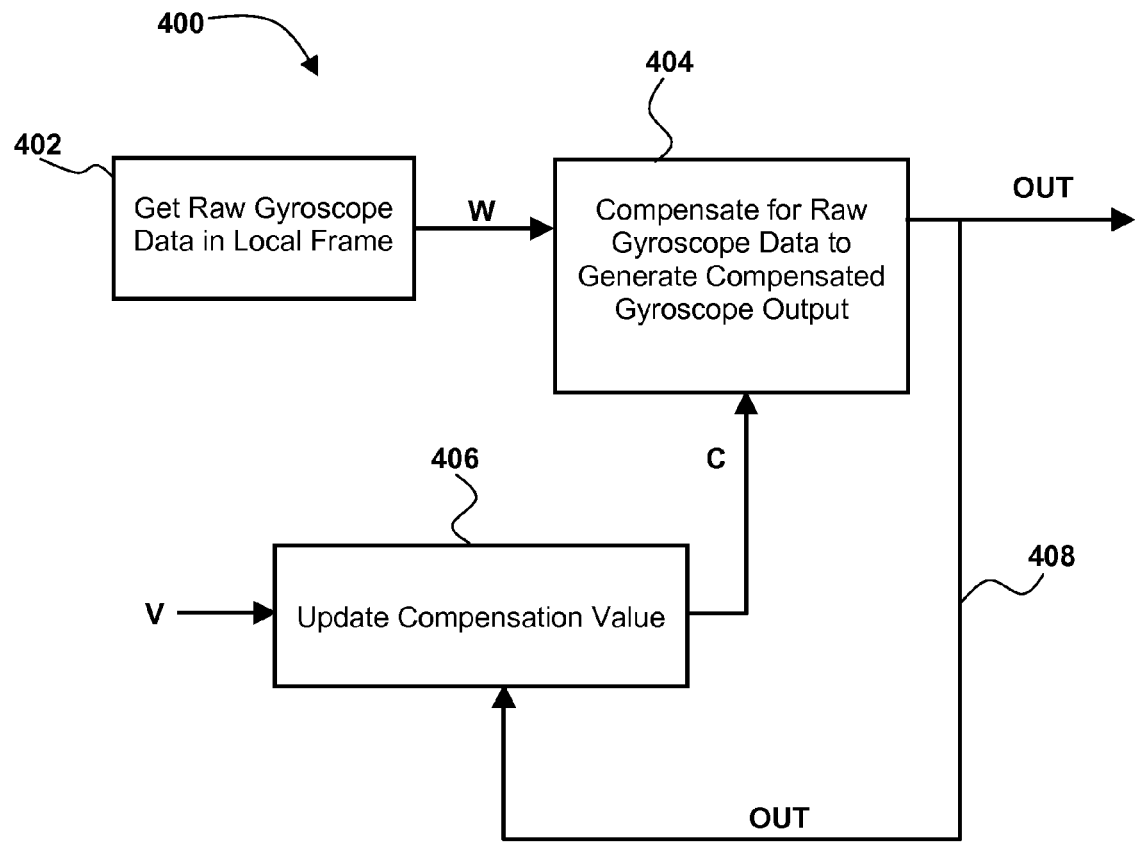
FIG. 4 is a flowchart of a method of using an estimated rotational velocity from an accelerometer and magnetometer to compensate for gyroscope bias in a portable electronic device.

The resulting rotational estimate V is then sent to a compensation module (as generally shown in FIG. 4) where it can be used to compensate for the gyroscope bias. The method 300 may then repeat the steps 302 to 312 (as indicated generally by 314) so as to prepare another estimate of the current rotational velocity of the portable electronic device 100. For example, in some embodiments the method 300 may be repeated more than once per second. In other embodiments, the method 300 may repeated between once per second and once every 60 seconds. In other embodiments, the method 300 may repeated between once per second and once every 10 seconds.

Generally speaking, the accelerometer 136 and magnetometer 152 tend to be noisy sensors in that they may be more susceptible to environmental and other factors that impact the precision of their measurements.

However, the accelerometer 136 and magnetometer 152 tend to be relatively unbiased sensors, and accordingly given a sufficient amount of time (e.g. for averaging), will tend to provide a more accurate estimation of the rotational velocity of the portable electronic device 100. For example, by taking a number of samples over a particular period of time, compensations can be made for the noise from the accelerometer 136 and magnetometer 152 to provide for a relatively accurate reading of the rotational velocity.

However the accelerometer 136 and magnetometer 152 relatively slow (for e.g., due to averaging or filtering of the data) in comparison to the gyroscope 154. In particular, the filtered accelerometer 136 and magnetometer 152 are generally not nearly as responsive as the gyroscope 154, and thus would be ill-suited for tracking gestures or quick movements of the portable electronic device 100 at the speed used for some applications (e.g. for gaming). Nevertheless, the accuracy over time of the accelerometer 136 and magnetometer 152 may be still useful for compensating for the gyroscope bias.

For example, turning to FIG. 4, illustrated therein is a flowchart of a method 400 for compensating for gyroscope bias using the estimated rotational velocity V calculated using the method 300.

At step 402, the raw output W of a gyroscope (e.g. the gyroscope 154) is determined. This raw output W is indicative of the measured rotational velocity of the portable electronic device (e.g. device 100), and as described above generally includes a time-variant gyroscope bias.

At step 404, a bias compensation is made to the raw output W using a compensation value C to generate a compensated gyroscope output OUT. In particular, the compensation value C is generated so as to compensate for the gyroscope bias, and will tend to vary with time.

Generally, the compensation value C is determined at step 406. In particular, the compensation value C may be based on the rotational velocity estimate V as determined using method 300 from the data from the accelerometer 136 and magnetometer 152 (or another electronic compass).

As shown the method 400 may also include a feedback loop 408. The feedback loop 408 may be used to adjust the compensation value C based on the compensated output OUT so as to further reduce noise and other errors in the compensated output OUT (in the next iteration of the method 400).

In particular, step 406 can be done using a first order infinite impulse response (IIR) loop filter. The bandwidth of the filter may be controlled by a control parameter epsilon ($\epsilon$). The control parameter $\epsilon$ can be selected with a value to tradeoff between how quickly variations in the gyroscope bias are tracked as compared to residual bias in the compensated output signal. Generally, the control parameter $\epsilon$ can be selected so that the speed of the feedback loop 408 is low (in some embodiments as low as possible) but is faster than the expected rate of variation of the gyroscope bias, which can depend on the properties of the gyroscope 154 (e.g. the gyroscope bias may vary by 30 degrees/sec/sec or more, and the control parameter $\epsilon$ can be tuned accordingly).

For instance, in some embodiments the control parameter $\epsilon$ can be selected so that the speed of the feedback loop 408 is more than 1 Hz. In other embodiments, control parameter $\epsilon$ can be selected so that the speed of the feedback loop 408 is more than 10 Hz. In yet other embodiments, control parameter $\epsilon$ can be selected so that the speed of the feedback loop 408 is less than 10 Hz.

For example, in some embodiments with typical gyroscope bias variability, the methods 300 and 400 may be operable to converge within a couple of minutes from initialization (e.g. from start-up) and thereafter track variations in the gyroscope bias with a residual error that is a fraction of one degree per second.

In some embodiments, one or more of the steps of the methods 300 and 400 as described above may be implemented in various manners. For example, one or more steps of the methods 300 and 400 may be implemented using one or more software modules, one or more hardware modules, or some combination thereof.

In some embodiments, the portable electronic device 100 may include one or more additional input apparatus, such as navigation keys or buttons, a physical or virtual keyboard, a trackpad, trackball, multimedia keys, and the like. For example, the housing 202 in this embodiment includes an auxiliary input device 212. The auxiliary input device 212 may be an optical navigation module (e.g. a trackpad or optical joystick) that responds to user interaction, and which may be used for navigating around the display screen 206, to select objects on the display screen 206, or for other purposes.

The housing 202 may also include other input devices (not shown), such as a dedicated phone application button, a disconnect call button, a home screen button, and the like. In various embodiments, these input devices may include optical sensors, mechanical buttons, or both. In some embodiments the portable electronic device 100 may include a keypad that includes a plurality of alphanumeric keys, which may be positioned in a plurality of rows and columns. In some embodiments, the keys may represent an alphabet and may be arranged in a standard keyboard layout (e.g. QWERTY, QWERTZ, DVORAK, etc.).

Some embodiments herein have referred to a portable electronic device that includes a housing, a touch-sensitive display exposed by a front of the housing, and functional components including memory and a processor coupled to the memory and the touch-sensitive display. The touch-sensitive display may also be referred to as a touchscreen display. However, the teachings herein are not limited to touchscreen devices, but may apply to other types of portable electronic devices such as candybar or slab devices, clamshell or flip devices, swivel devices, and various combinations thereof. In particular, in some examples, the devices may include a keypad and touchscreen, and may include one or more auxiliary buttons, or may include a touchscreen without a keypad. Furthermore, in some embodiments the teachings herein may be used for tablet computing devices.

While the above description provides examples of one or more processes or apparatuses, it will be appreciated that other processes or apparatuses may be within the scope of the accompanying claims.

The invention claimed is:

1. A method for compensating for gyroscope bias on a portable electronic device having a gyroscope, an accelerometer and a magnetometer, the method comprising:
   determining a first attitude matrix and a second attitude matrix using data from the accelerometer and the magnetometer, each attitude matrix being a 3×3 matrix that describes the orientation of the portable electronic device with respect to a global coordinate system;
   determining a difference between the first attitude matrix and the second attitude matrix;
   estimating a rotational velocity based on the difference between the first attitude matrix and the second attitude matrix; and
   compensating for an output from the gyroscope to generate a compensated output that compensates for the gyroscope bias using the estimated rotational velocity.

2. The method of claim 1, wherein said determining of the first attitude matrix and the second attitude matrix comprises determining three local frame vectors for each attitude matrix.

3. The method of claim 2, wherein the three local frame vectors include an EAST vector, a NORTH vector and an UP vector as determined from the accelerometer and magnetometer.

4. The method of claim 1, wherein said estimating of the rotational velocity comprises determining a mean of a cross product of the local frame vectors of the second attitude matrix and the local frame vectors of the difference between the first and second attitude matrices.

5. The method of claim 1, wherein said compensating for the output comprises generating a compensation value based on the rotational velocity estimate.

6. The method of claim 5, wherein the compensation value is adjusted using a feedback loop to compensate for errors in the compensated output.

7. The method of claim 6, wherein the feedback loop comprises a first-order infinite impulse response loop filter with a control parameter.

8. The method of claim 7, wherein the control parameter is selected so that the speed of the feedback loop is faster than the expected rate of variation of the gyroscope bias.

9. The method of claim 1, wherein the gyroscope is a MEMS gyroscope.

10. A portable electronic device, comprising:
    a gyroscope for detecting the rotational velocity of the device;
    an accelerometer for detecting the acceleration experienced by the device;
    a magnetometer for determining the position and orientation of the device with respect to a magnetic field; and
    at least one processor coupled with the gyroscope, the accelerometer and the magnetometer, the at least one processor adapted to:
       determine a first attitude matrix and a second attitude matrix using data from the accelerometer and the magnetometer, each attitude matrix being a 3×3 matrix that describes the orientation of the portable electronic device with respect to a global coordinate system;
       determine a difference between the first attitude matrix and the second attitude matrix;
       estimate a rotational velocity based on the difference between the first attitude matrix and the second attitude matrix; and
       compensate for an output from the gyroscope to generate a compensated output that compensates for the gyroscope bias using the estimated rotational velocity.

11. The device of claim 10, wherein the processor is adapted to determine the first attitude matrix and the second attitude matrix by determining three local frame vectors for each attitude matrix.

12. The device of claim 11, wherein the three local frame vectors include an EAST vector, a NORTH vector and an UP vector as determined from the accelerometer and magnetometer.

13. The device of claim 10, wherein the processor is adapted to estimate the rotational velocity estimate by determining a mean of a cross product of the local frame vectors of the second attitude matrix and the local frame vectors of the difference between the first attitude matrix and the second attitude matrix.

14. The device of claim 10, wherein the processor is adapted to compensate for the output by generating a compensation value based on the rotational velocity estimate.

15. The device of claim 14, wherein the compensation value is adjusted using a feedback loop to compensate for errors in the compensated output.

16. The device of claim 15, wherein the feedback loop comprises a first-order infinite impulse response loop filter with a control parameter.

17. The device of claim 16, wherein the control parameter is selected so that the speed of the feedback loop is faster than the expected rate of variation of the gyroscope bias.

18. The device of claim 10, wherein the gyroscope is a MEMS gyroscope.

19. A method for compensating for gyroscope bias on a portable electronic device having a gyroscope, an accelerometer and an electronic compass, the method comprising:
    determining a first attitude matrix and a second attitude matrix using data from the accelerometer and the electronic compass, each attitude matrix being a 3×3 matrix that describes the orientation of the portable electronic device with respect to a global coordinate system;
    estimating a rotational velocity based on a difference between the first attitude matrix and the second attitude matrix; and
    compensating for an output from the gyroscope to generate a compensated output that compensates for the gyroscope bias using the estimated rotational velocity.

20. The method of claim 19, wherein the electronic compass is a magnetometer.

\* \* \* \* \*